(12) United States Patent
Soo et al.

(10) Patent No.: US 10,345,376 B1
(45) Date of Patent: Jul. 9, 2019

(54) BINARY SIGNAL GENERATOR

(71) Applicant: Texas Instruments Incorporated, Dallas, TX (US)

(72) Inventors: Kui Ting Soo, Bedford, NH (US); Michael Cayanan Ramirez, Manchester, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/901,444

(22) Filed: Feb. 21, 2018

(51) Int. Cl.
*G01R 31/317* (2006.01)
*G01R 31/3177* (2006.01)

(52) U.S. Cl.
CPC ... *G01R 31/31703* (2013.01); *G01R 31/3177* (2013.01); *G01R 31/31713* (2013.01); *G01R 31/31727* (2013.01)

(58) Field of Classification Search
CPC ........ G01R 31/31703; G01R 31/31713; G01R 31/31727; G01R 31/3177; G01R 31/317
See application file for complete search history.

(56) References Cited

U.S. PATENT DOCUMENTS

| 5,179,348 | A | * | 1/1993 | Thompson | G06F 1/0321 327/105 |
| 5,332,975 | A | | 7/1994 | Young et al. | |
| 7,065,466 | B2 | * | 6/2006 | Clarke | G01R 27/28 324/601 |
| 7,508,898 | B2 | * | 3/2009 | Cyr | H01L 24/06 375/375 |
| 8,639,995 | B1 | * | 1/2014 | Gorshe | G01R 31/31703 714/738 |

* cited by examiner

*Primary Examiner* — Phung M Chung
(74) *Attorney, Agent, or Firm* — Ronald O. Neerings; Charles A. Brill; Frank D. Cimino (57) ABSTRACT

A binary signal generator circuit includes a programmable waveform generator (PWG) having an input stage for receiving a digital data stream, a serial clock signal for controlling receipt of the digital data, a frequency synchronization and a clock signal. The PWG includes registers including a first and second register for storing bits representing a first frequency (f1) and for storing bits representing a zero frequency (fo), respectively. A MUX receives a control signal based on the digital data for toggling between bits representing f1 and fo coupled to a digital-to-analog converter (DAC) with an output providing a modulated signal that toggles between essentially f1 and essentially fo. A differential output amplifier receives the modulated signal for generating a first and second amplified signal modulated between essentially f1 and essentially fo. The first and second amplified signal are phase shifted relative to one another, taken together providing a differential signal.

19 Claims, 6 Drawing Sheets

FIG. 3D ized as a fully differential operational amplifier having
BINARY SIGNAL GENERATOR

FIELD

Disclosed embodiments relate to binary signal generators, such as for the binary state testing of semiconductor circuits performed by automatic test equipment (ATE).

BACKGROUND

A binary state for ATE digital testing of semiconductor circuits is conventionally implemented by forcing a difference of voltage levels to indicate whether the current state is a "0" or "1". Most digital ATE systems generate and/or acquire patterns of 1's and 0's to stimulate a device under test (DUT) for its digital testing. With recent innovations in digital components, however, these systems generally involve a more sophisticated digital tester with capabilities beyond a simple logic analyzer with just two voltage states being only an on and an off state. Programmable voltage levels can be provided by the ATE, such as ten (10) or more states between −2.0 V and 5.5 V, to create a flexible digital system that can interface with multiple logic families, or characterize the upper and lower operating bounds for a specific DUT.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize a known problem with ATEs for digital testing of semiconductor circuits having differential inputs is that there is no available way to force binary states (0 and 1 states) for testing a DUT using a difference in test signal frequency. As described above, conventionally a difference in voltage levels is used to test the DUT for "0" state and for the "1" state.

Disclosed binary test systems include a binary signal generator comprising a programmable waveform generator (PWG) coupled to a differential output amplifier for converting a received digital bit stream (e.g., bits received from an ATE digital resource) into a differential output signal. The PWG has an input stage including inputs adapted to receive a digital data stream, a serial clock signal for controlling receipt of the digital data stream, a frequency synchronization signal, a master clock signal, and control logic that receives the digital data. The PWG also includes registers including a first register and a second register each for storing bits of a digital word representing two different frequencies, referred to herein as a first frequency (f1, representing binary 1) and for storing bits of a word representing a zero frequency (fo, representing binary 0).

A multiplexer (MUX) receives a control signal from the control logic that is based on the digital data stream to control the MUX to toggle between bits representing f1 and fo. The output of the MUX is coupled to a digital-to-analog converter (DAC) that has an output providing modulated signals that toggles between essentially f1 and essentially fo. As used herein, essentially f1 and essentially fo means the digital to analog conversion provided at the DAC output is generally not exactly what the bits in the word indicate the frequency value is, which is typically within a few % of what the bits indicate the corresponding frequency value is. This difference can be caused by multiple factors that can affect this frequency accuracy, including the accuracy of the master clock, circuit layout, and grounding, besides the accuracy of the DAC itself.

A differential output amplifier has an input coupled to receive the modulated signal and first and second outputs for generating an amplified signal which is modulated to reflect the digital data stream received by the input stage between essentially f1 and essentially fo that together provide a differential output signal. The first and second amplified signal are phase shifted by 180 degrees relative to one another.

BRIEF DESCRIPTION OF THE DRAWINGS

Reference will now be made to the accompanying drawings, which are not necessarily drawn to scale, wherein.

DETAILED DESCRIPTION

Example aspects in this Disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
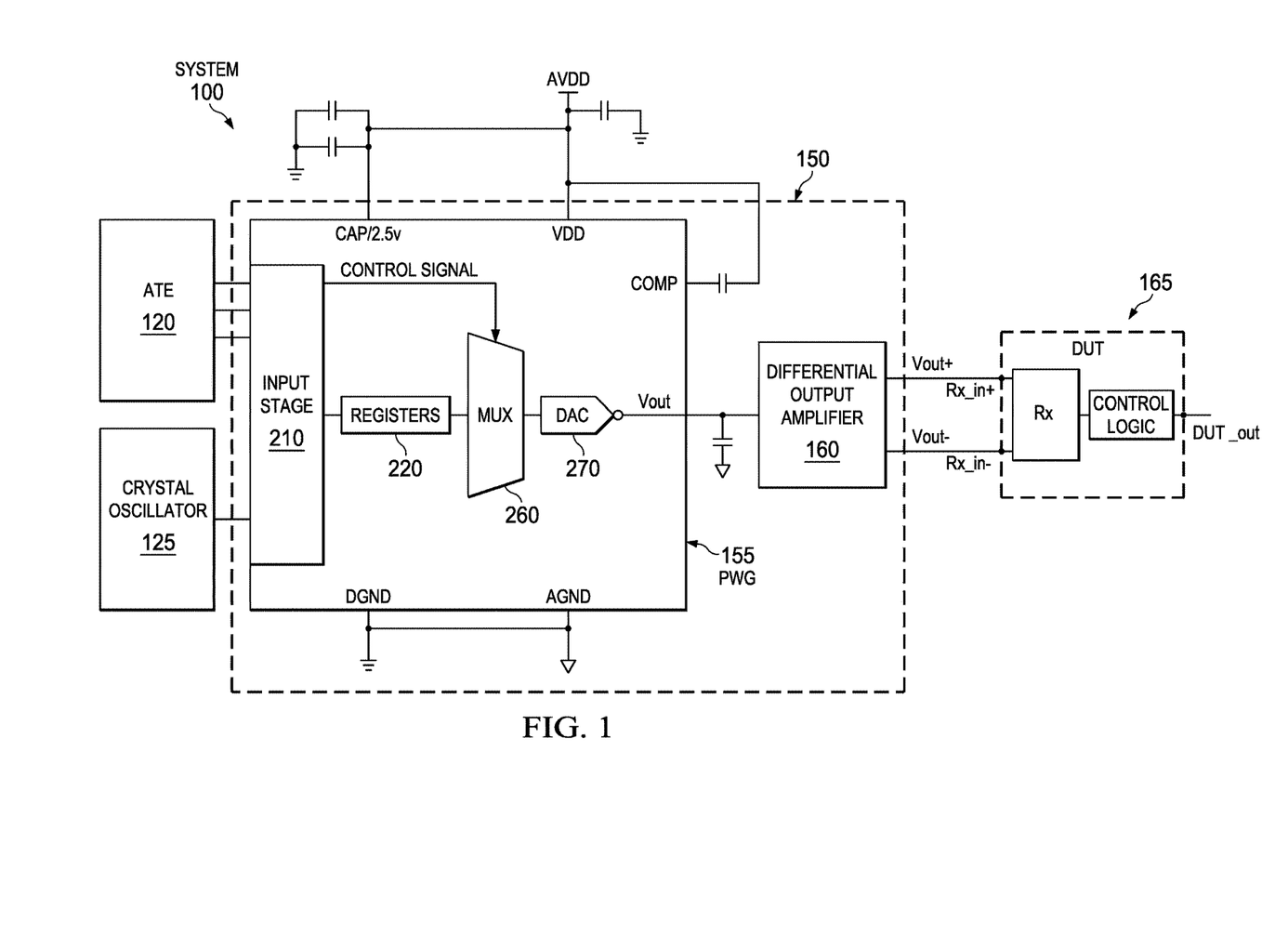
FIG. 1 is diagram showing an example binary test system for testing electronic circuits that have a differential input comprising a programmable binary signal generator including a PWG coupled to receive control signals and a digital data stream to provide a modulated signal that toggles between essentially f1 and essentially fo, and a differential output amplifier that receives the modulated signal and generates a differential output comprising a first and a second amplified signal both modulated between essentially f1 and essentially fo, according to an example aspect.

FIG. 1 is a diagram showing an example binary test system 100 for testing electronic circuits that have a differential input comprising a disclosed binary signal generator circuit 150. The binary signal generator 150 includes a PWG 155 shown including an input stage 210 coupled to receive a control signal (frequency synch, FSYNC), clock signals (a serial clock (SCLK), and a master clock (MCLK) signal provided by the crystal oscillator 125 (e.g., oscillating at 16 MHz) shown, and a digital data stream (Serial Data (SDATA)) including data bits (e.g., a word), where state 0 represents fo and state 1 represents f1, from an ATE 120. The ATE 120 can be a commercially available ATE. Although an ATE 120 is shown in FIG. 1, an ATE can also be replaced by a bench setup A difference between f1 and fo can be <20 Hz. For example, for the FSK testing of a Power-line communications (PLC) DUT 165, such as a PLC receiver, the differential output signals provided by binary signal generator circuit 150 (taken between Vout+ and Vout−) are modulated signals (sine waves) including binary 1 known as the "mark" frequency which may be a 131 KHz sine wave (shown in FIG. 3A described below, herein f1) and binary 0 known as the "space" frequency which may be a 143 KHz sinewave (shown in FIG. 3B described below, herein fo). By convention the mark frequency corresponds to the lower frequency. In FSK, data is transmitted by shifting the frequency of a continuous carrier in a binary manner to one or the other of the two discrete frequencies.

PWG 155 is also shown including a register block 220 having registers for storing bits representing a first frequency (f1) and for storing bits representing a zero frequency (fo), a MUX 260, and a DAC 270. The output of the DAC 270 is connected to an input of a differential output amplifier 160.

Figure 2A:
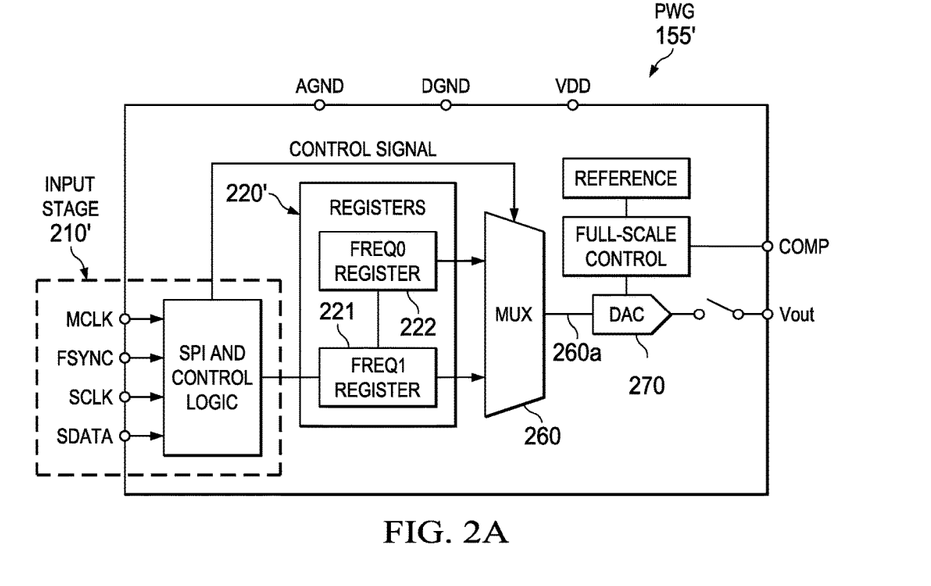
FIG. 2A shows a simplified example PWG circuit realization comprising an input stage for receiving a digital data stream, control data, and clocks, a register for storing bits for representing f1 and for representing fo, a MUX coupled to receive a control signal based on the digital data stream for toggling between bits representing f1 and bits representing fo, and a digital-to-analog converter (DAC) that has an output (Vout) which provides a modulated signal that toggles between essentially f1 and essentially fo.

PWG 155' in FIG. 2A shows an input stage 210' having a Serial Peripheral Interface (SPI) input and control logic. The registers of the PWG 155' can be controlled and programmed for programming fo and programming f1 via the SPI input (as a programming input) and the control logic. The digital commands from the ATE 120 can be sent to the FIG. 2A control logic. PWG 155' comprises registers 220' comprising FREQ1 register 221 and FREQ0 register 222, a MUX 260, and a DAC 270. The FREQ1 register 221 is for storing bits representing a programmed f1, and the FREQ0 register 222 is for storing bits representing a programmed fo. The input stage 210' is shown including an SDATA input for receiving the serial digital data stream, such as in the form of a 16-bit serial data-word (see the example 7 bit data stream in FIG. 3D described below), a FSYNC input for receiving a FSYNC signal, and clocks inputs including a SCLK signal at a SCLK input, and a MCLK signal at a MCLK input. The ATE 120 inputs to the PWG as shown in FIG. 2A over the SPI can be controlled by the input/output IO pins of the ATE 120.

Before commencing test operations, a reset signal may be applied to reset the PWG 155, 155' to initialize the PWG to remove any unnecessary output. During test operation the PWG 155, 155' may receive a new digital data stream (a new word) when the FSYNC signal is pulled high or low, typically from an ATE. For example, when the FSYNC signal is taken low, internal logic on PWG 155 can be informed that a new word is being loaded in. New data may be clocked into the PWG on each falling edge of the SCLK.

As described above, the MUX 260 is controlled by control signals received from the control logic which receives the digital data that controls the MUX 260 to toggle between bits representing f1 and bits representing fo. The DAC 270 that has an output (Vout) which provides a modulated signal that toggles between essentially f1 and essentially fo. As one particular example, PWG 155' can comprise the AD9837 from Analog Devices Incorporated which is a low power, programmable waveform generator capable of producing sine, triangular, or square wave outputs. The output frequency and phase for this particular PWG device are software programmable, allowing frequency and phase tuning, where the frequency registers are 28 bits wide, and with a 16 MHz clock rate a frequency resolution of 0.06 Hz, and with a 5 MHz clock rate it can be tuned to a 0.02 Hz frequency resolution.

Disclosed programmable binary signal generator circuits as described above can be controlled using the digital resources of an ATE 120. There can be an on board self-calibrate mechanism on the PWG 155 or 155' to ensure the frequency of Vout will not deviate more than about 0.5 KHz. The FREQ0 register 222 and FREQ1 register 221 can each be configured to a desired frequency by programming the correct bits to each. One can thus calibrate the accuracy of the frequency provided by the binary signal generator circuit 150 prior to the DUT testing process.

The frequency calibration can comprise reprogramming the FREQ1 register 221 and FREQ0 register of the PWG, measuring the frequency at Vout+ or Vout−, and tuning the frequency to the desired frequency by iteratively reprogramming the FREQ1 221 and FREQ0 222 registers. In order to tune the binary signal generator circuit 150 to the desired frequency for DUT testing, software on the ATE 120 side can automatically program initial bit values on each of the FREQ register 221, 222, then measure the actual frequency at the outputs (Vout+ and Vout−) of the signal generator circuit. If the measured frequency is not accurate, then the frequency can be tuned by programming with either higher or lower bit values on the respective registers 221, 222 until an acceptable frequency is measured at the outputs.

Because DUT 165 needs a differential signal to test its differential input, the output from PWG 155 is fed into differential output amplifier 160 which splits the received modulated signal into 2 different waveforms with a 180 degree phase difference between the waveforms, Vout+ at a first output and Vout− at a second output, where their signs indicate their out of phase relationship. As described above, Vout+ and Vout− both toggle between essentially f1 and essentially fo. Vout+ at a first output is coupled to Rx in+ of DUT 165 and Vout− at a second output is coupled to Rx in− of DUT 165.

Figure 2B:
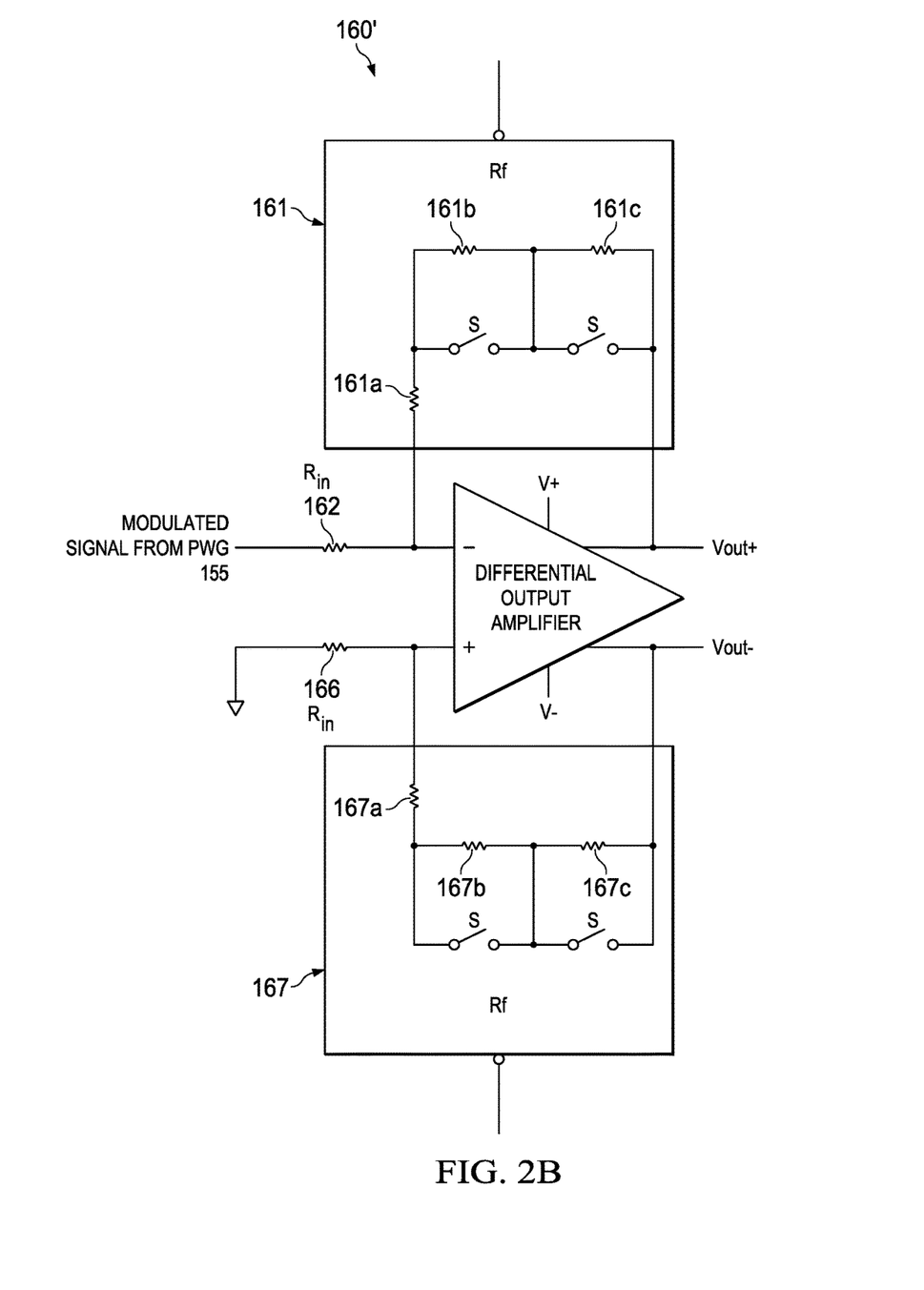
FIG. 2B shows an example differential output amplifier realized as a fully differential operational amplifier having closed loops with a feedback resistor network for the first amplifier output and for the second amplifier output, configured so that a voltage at the first amplifier output and the second amplifier output are equal, but are of opposite polarity.

FIG. 2B shows an example differential output amplifier realized as a fully differential operational amplifier 160' having closed loops with a feedback resistor (Rf) 161 for the first amplifier output (Vout+) and a Rf 167 for the second amplifier output (Vout−), configured so that a voltage at the first amplifier output and the second amplifier output are equal, but are opposite in polarity. There are also inputs resistors shown as Rin 162 and Rin 166 that together with their associated Rf set the amplifier gain. However, the differential output amplifier can comprise circuitry other than a fully differential operational amplifier. For example, it may be possible to use separate parallel connected operation amplifiers with one operational amplifier path having an analog delay line to provide a 180 degree phase delay. Alternatively, one can use two separate single ended operation amplifiers with one configured as an inverting amplifier and the other as a non-inverting amplifier in order to achieve the desired differential output signal.

The fully differential operational amplifier 160' receives a modulated signal from the PWG 155. There are commercially available single-supply single-ended to differential conversion circuits that provide fixed gain (e.g., 1, 2, 5, or 10) and respective output signals that are the same amplitude and frequency, but are shifted 180 degrees to one another. As shown in FIG. 2B, Rf 161 and Rf 167 each comprise a feedback resistor network including at least one electronic switch (S) therein for varying a gain to obtain a predetermined gain level to achieve a desired amplitude for the differential signal. Rf 161 is shown including resistors 161a, 161b, 161c, with resistors 161b and 161c shown each including a parallel connected S. Rf 167 is also shown including resistors 167a, 167b, 167c, with resistors 167b and 167c shown each including a parallel connected S. The feedback resistor networks can comprise chip resistors for better matching. This adjustable signal amplitude feature enables testing the DUT for maximum and minimum sensitivity. As noted above, in one particular aspect, the DUT can comprise a PLC receiver.

The binary signal generator circuit 150 can accommodate a narrow band of frequency changes because the PWG 155 selected can have a high frequency resolution, such as about 0.05 Hz to 0.10 Hz, and the differential output amplifier 160 selected to have enough drive (such as a high output current op-amp providing at least 2 Amperes) to overcome a bandpass filter that is generally on the PLC input when testing PLC receiver circuits. Because the binary signal generator circuit 150 can be frequency calibrated (including calibrated automatically), it also works well across temperature changes.

Below is a list of challenges or problems that can be overcome by a disclosed binary signal generator circuit 150.
1. Enabling an ATE with a disclosed binary signal generator circuit 150 to modulate a periodic wave such as a sinewave or square wave to perform binary "0" and binary "1" testing of a DUT having a differential input. As noted above, traditionally, binary states for an ATE are set using 2 different voltage levels. With a disclosed binary signal generator circuit, the binary states are set instead using 2 different frequencies (fo, and f1 as used herein).
2. Enabling PLC circuit testing to now be tested using an ATE. As noted above, PLC receiver circuit testing in one example application needs an applied FSK sine wave at 131.25 kHz (f0) and at 143.75 kHz (f1). In this application 131.25 kHz represents f1 and 143.75 kHz represents f0. The amplitude of the periodic wave is at 142 mVrms at the maximum and 1.2 mVrms at the minimum amplitude. It is needed to force such a sinewave to the PLC circuit, but a conventional ATE can only output first and second fixed voltage levels that denote "0" and "1". A disclosed binary signal generator circuit can be used together with an ATE (such as shown in FIG. 1) to automatically test this PLC circuit parameter.
3. Providing accurate frequencies to denote fo and f1. As described above, disclosed binary signal generator circuit can calibrate the accuracy of the frequency prior to the DUT testing process. This can be done as described above by frequency programming the registers of PWG of the binary signal generator circuit with digital words, measuring the resulting essentially f1 and essentially f0, and then tuning the essentially f1 and essentially f0 to the desired frequencies f1 and fo by changing (reprogramming) the digital words, all performable via firmware.

EXAMPLES

Disclosed embodiments of the invention are further illustrated by the following specific Examples, which should not be construed as limiting the scope or content of this Disclosure in any way.

Figure 3A:
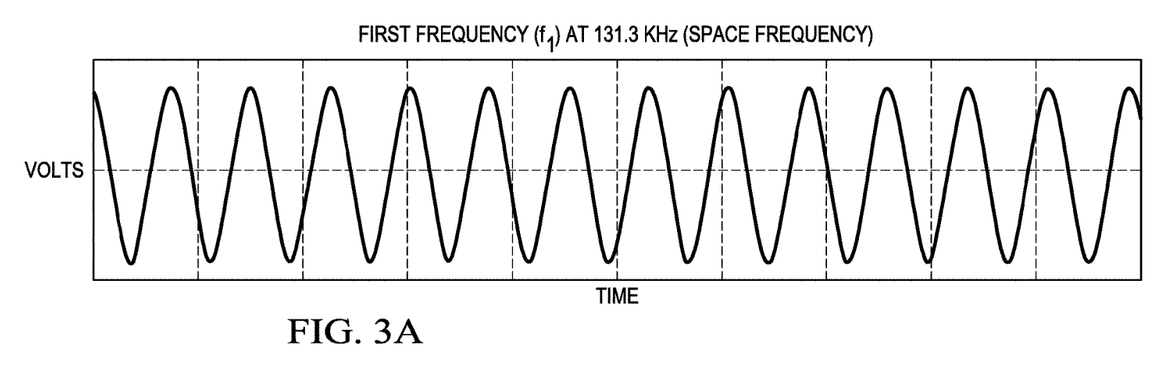
FIG. 3A shows an example sine wave at f1 provided at an output of a disclosed binary signal generator corresponding to time intervals when the digital data stream is at the 1 state.
Figure 3B:
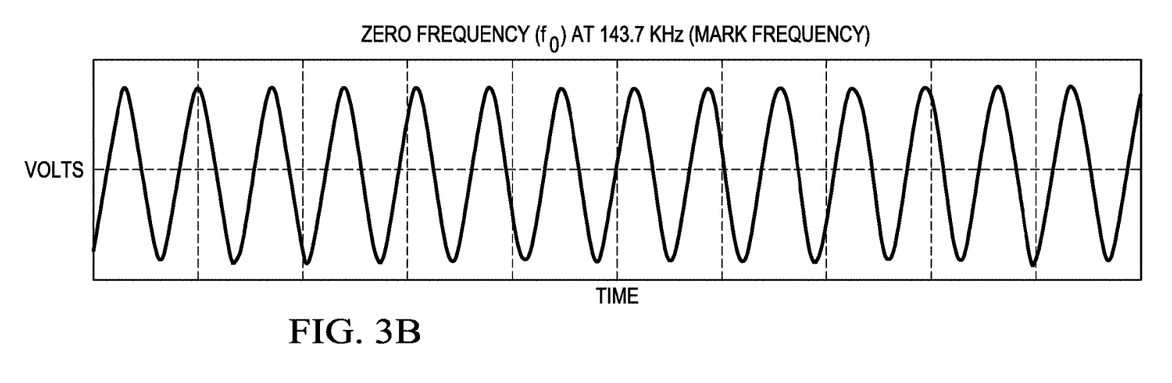
FIG. 3B shows another example sine wave at f0 provided at an output of a disclosed binary signal generator corresponding to time intervals when the digital data stream is at the 0 state.
Figure 3C:
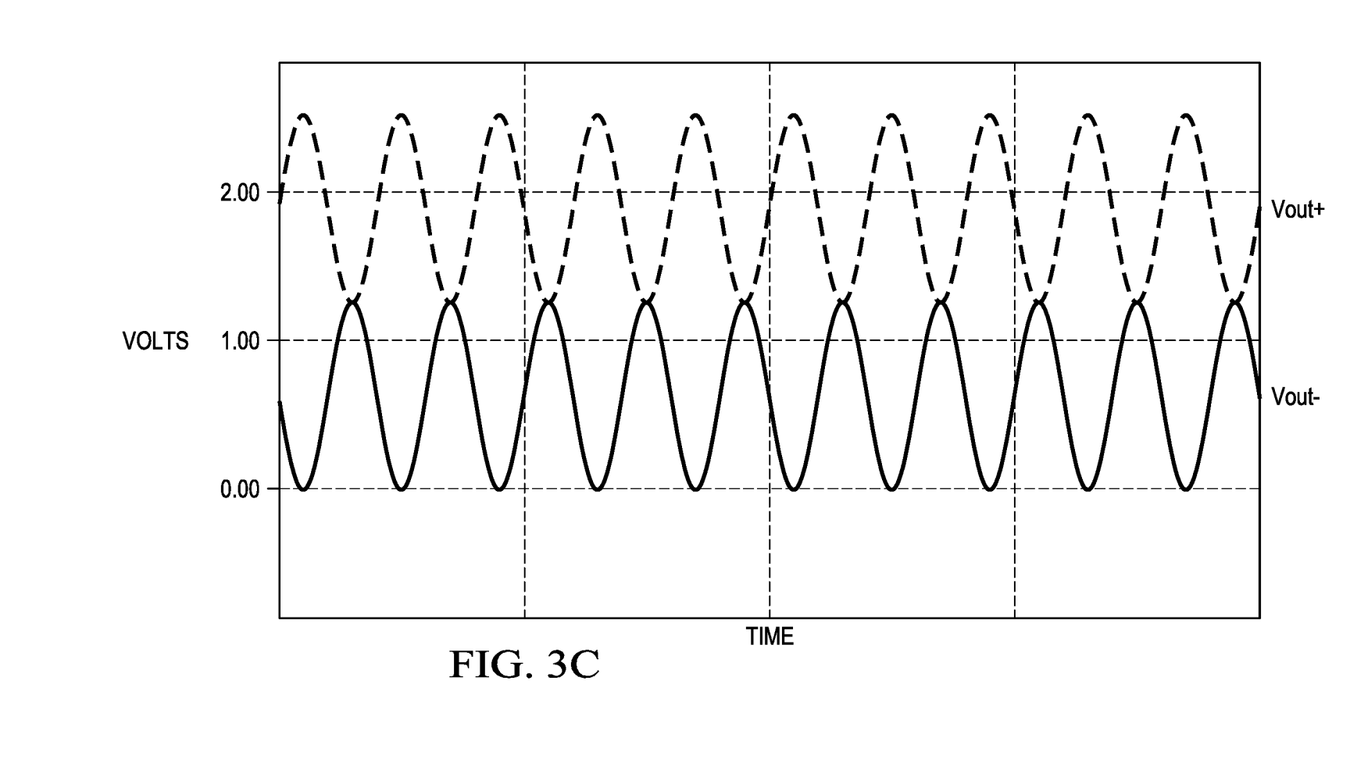
FIG. 3C shows an example differential signal output provided by a disclosed binary signal generator taken between differential output amplifier outputs shown as Vout+ and Vout− which can be seen to be respective sine waves having the same frequency and amplitude, but with a different phase that is shown shifted 180 degrees relative to one another.

FIG. 3A shows an example sine wave at the first frequency f1 provided at an output by a PWG corresponding to time intervals when the digital data stream is at the 1 state. F1 is shown being 131.3 kHz (the space frequency) used for binary 1 testing a PLC receiver. FIG. 3B shows another example sine wave at the zero frequency f0 provided at an output of a PWG corresponding to time intervals when the digital data stream is at the 0 state. F0 is shown being 143.7 kHz (the mark frequency) used for binary 0 testing a PLC receiver. FIG. 3C shows an example differential signal output by a disclosed binary signal generator circuit 150. There is a Vout+ signal and a Vout− signal which have essentially the same frequency and amplitude, but as shown have a different phase, shown shifted 180 degrees.

Figure 3D:
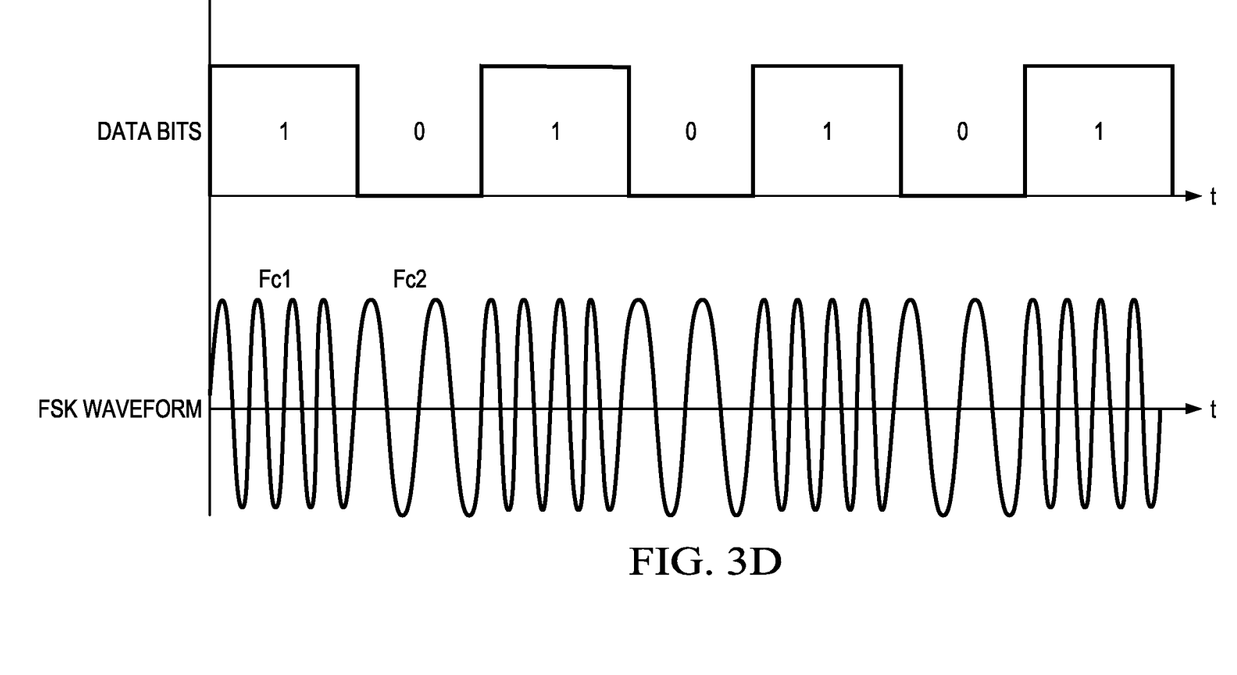
FIG. 3D shows an example digital data stream shown as 7-bits received from an ATE and the resulting Frequency-shift keying (FSK) sine wave generated at an output of a disclosed binary signal generator which responsive to receiving the digital data stream toggles between essentially f1 (responsive to the 1's) and essentially fo (responsive to the 0's).

FIG. 3D shows example data including data bits 1010101 received from an ATE and the resulting FSK waveform generated therefrom by a disclosed binary signal generator circuit 150. For example, if one wants to FSK modulate a data stream of 101010 for testing a DUT, the outputs of the binary signal generator circuit 150 (at both Vout+ and Vout−) includes a 131 KHz sinewave (binary 1) period followed by a 143 KHz sinewave (binary 0) period, then followed by 131 KHz (binary 1) sinewave, etc.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:
1. A binary signal generator circuit, comprising:
  a programmable waveform generator (PWG) including:
    an input stage including control logic adapted to receive a digital data stream, a serial clock input for controlling receipt of said digital data stream;
    registers including a first register for storing bits representing a programmed first frequency (f1) and a second register, which is parallel connected to the first register, for storing bits representing a programmed zero frequency (fo);
    a multiplexer (MUX) coupled to receive a control signal from said control logic that is based on said digital data stream for toggling between said bits representing said f1 and said bits representing said fo, said MUX having an output coupled to a digital-to-analog converter (DAC) that has an output (Vout) which responsive to said digital data stream provides a modulated signal that toggles between essentially said f1 and essentially said fo;

a differential output amplifier having an input coupled to receive said modulated signal for generating a first amplified signal which is modulated between essentially said f1 and essentially said fo provided at a first amplifier output, and a second amplified signal which is modulated between essentially said f1 and essentially said fo provided at a second amplifier output, wherein said first amplified signal and said second amplified signal are output signals of the binary signal generator and are phase shifted relative to one another.

2. The binary signal generator circuit of claim 1, wherein said differential output amplifier comprises a fully differential operational amplifier having closed loops with a feedback resistor network for said first amplifier output and for said second amplifier output that are each configured so that a voltage at said first amplifier output and a voltage at said second amplifier output are equal, but are opposite in polarity.

3. The binary signal generator circuit of claim 2, wherein said feedback resistor networks include at least one electronic switch for varying an amplifier gain to obtain a predetermined gain level.

4. The binary signal generator circuit of claim 3, wherein said feedback resistor networks comprise chip resistors.

5. The binary signal generator circuit of claim 1, wherein said input stage further comprises a 3-wire Serial Peripheral Interface (SPI), wherein said digital data stream, and said serial clock input are adapted to be provided by automated test equipment (ATE) over said 3-wire SPI.

6. The binary signal generator circuit of claim 1, wherein said control logic provides programmability of said first register and said second register for setting said programmed fo and for setting said programmed f1, respectively.

7. The binary signal generator circuit of claim 1, wherein said modulated signal comprises a sine wave.

8. The binary signal generator circuit of claim 1, wherein said PWG includes a user programmable phase.

9. A method of digital testing a device under test (DUT) having a differential input, comprising:

programming a programmable waveform generator (PWG) having control logic, a first register and a parallel connected second register with bits representing a first frequency (f1) and a zero frequency (fo), respectively;

receiving at an input stage of said PWG a digital data stream and a serial clock input for controlling receipt of said digital data stream, said PWG having a multiplexer (MUX) receiving a control signal that is based on said digital data stream and in response toggling between said bits representing said f1 and said bits representing said fo, said MUX having an output coupled to a digital-to-analog converter (DAC) that has an output (Vout) which responsive to said digital data stream provides a modulated signal that toggles between essentially said f1 and essentially said fo;

processing said modulated signal to generate a first amplified signal which is modulated between essentially said f1 and essentially said fo provided at a first amplifier output and a second amplified signal which is modulated between essentially said f1 and essentially said fo provided at a second amplifier output, wherein said first amplified signal and said second amplified signal are phase shifted relative to one another, and coupling said first amplified signal and said second amplified signal as a differential signal to said differential input to test said DUT.

10. The method of claim 9, wherein said digital data stream, and said serial clock input are all provided by automated test equipment (ATE).

11. The method of claim 10, wherein said input stage comprises a 3-wire Serial Peripheral Interface (SPI), wherein said digital data stream, and said serial clock input are adapted to be provided by automated test equipment (ATE) over said 3-wire SPI.

12. The method of claim 9, wherein said first amplified signal and said second amplified signal have a same peak-to-peak voltage amplitude and are 180 degrees out of phase with one another.

13. The method of claim 12, further comprising changing said peak-to-peak voltage amplitude of said first amplified signal and said second amplified signal by switching at least one electronic switch in a feedback resistor network of an amplifier providing said first and second amplified output signals for varying a gain of said amplifier to obtain a predetermined gain level.

14. The method of claim 9, further comprising automatically calibrating said essentially said f1 and essentially said fo comprising changing a programming input applied to a control logic so that frequencies provided by said first amplified signal and said second amplified signal more closely approach said f1 and said fo.

15. The method of claim 9, wherein said modulated signal comprises a sine wave.

16. The method of claim 9, wherein said sine wave comprises a frequency-shift keying (FSK) modulated sine wave, and wherein a difference between said f1 and said fo is <20 Hz.

17. The method of claim 9, wherein said DUT comprises a power line communication (PLC) receiver.

18. The method of claim 9, further comprising applying a reset signal to reset said PWG before said receiving said digital data stream.

19. A method of digital testing a device under test (DUT) having a differential input, comprising:

programming a programmable waveform generator (PWG) having control logic, a first register and a parallel connected second register with bits representing a first frequency (f1) and a zero frequency (fo), respectively;

receiving at an input stage of said PWG a digital data stream and a serial clock input for controlling receipt of said digital data stream, said PWG having a multiplexer (MUX) receiving a control signal from said control logic that is based on said digital data stream and in response toggling between said bits representing said f1 and said bits representing said fo, said MUX having an output coupled to a digital-to-analog converter (DAC) that has an output (Vout) which responsive to said digital data stream provides a modulated signal that toggles between essentially said f1 and essentially said fo;

processing said modulated signal to generate a first amplified signal which is modulated between essentially said f1 and essentially said fo provided at a first amplifier output and a second amplified signal which is modulated between essentially said f1 and essentially said fo provided at a second amplifier output, wherein said first amplified signal and said second amplified signal are phase shifted by 180 degrees relative to one another, and coupling said first amplified signal and said second amplified signal as a differential signal to said differential input to test said DUT.

\* \* \* \* \*